(12) United States Patent
Lee et al.

(10) Patent No.: US 10,651,243 B2
(45) Date of Patent: May 12, 2020

(54) DISPLAY DEVICE

(71) Applicant: SAMSUNG DISPLAY CO., LTD., Yongin-si, Gyeonggi-Do (KR)

(72) Inventors: Ji Seon Lee, Seoul (KR); Moo Soon Ko, Seoul (KR); Se Wan Son, Yongin-si (KR); Jin Sung An, Seongnam-si (KR); Seong Jun Lee, Seoul (KR); Wang Woo Lee, Osan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/133,836

(22) Filed: Sep. 18, 2018

(65) Prior Publication Data
US 2019/0206952 A1 Jul. 4, 2019

(30) Foreign Application Priority Data
Jan. 4, 2018 (KR) .......................... 10-2018-0001256

(51) Int. Cl.
*H01L 27/32* (2006.01)

(52) U.S. Cl.
CPC ...... *H01L 27/3223* (2013.01); *H01L 27/3262* (2013.01); *H01L 27/3276* (2013.01); *H01L 2251/5392* (2013.01)

(58) Field of Classification Search
CPC ............... H01L 27/3223; H01L 27/326; H01L 27/3276; H01L 27/14603; H01L 27/14605; H01L 27/3279
See application file for complete search history.

(56) References Cited

U.S. PATENT DOCUMENTS

2019/0043911 A1* 2/2019 Honda .............. H01L 27/14636

FOREIGN PATENT DOCUMENTS

KR         10-1641690       7/2016
KR       10-2016-0129174   11/2016

\* cited by examiner

*Primary Examiner* — Hsien Ming Lee
(74) *Attorney, Agent, or Firm* — F. Chau & Associates, LLC

(57) ABSTRACT

A display device includes: a substrate that includes a first area and a second area; a plurality of pixels included in the first area; and a dummy pattern included in the second area, wherein a size of the dummy pattern is smaller than a pixel area corresponding to a first pixel among the plurality of pixels, a ratio of an area occupied by a pixel pattern of the first pixel with respect to the pixel area is a first value, a ratio of an area occupied by the dummy pattern with respect to a dummy area is a second value that is greater than the first value, and the dummy area and the pixel area have the same size as each other.

12 Claims, 13 Drawing Sheets

DISPLAY DEVICE

CROSS-REFERENCE TO RELATED APPLICATION

This application claims priority under 35 U.S.C. § 119 to Korean Patent Application No. 10-2018-0001256 filed in the Korean Intellectual Property Office on Jan. 4, 2018, the disclosure of which is incorporated by reference herein in its entirety.

TECHNICAL FIELD

The present invention relates to a display device. More particularly, the present invention relates to a display device that has uniform conductive patterns.

DESCRIPTION OF THE RELATED ART

A display device may include a display area including a plurality of pixels, and a peripheral area at a periphery of the display area. Conductive patterns that correspond to the pixels may be arranged in the display area. Wires or circuits for writing data to the pixels may be disposed in the peripheral area.

To form a conductive pattern, a photoresist is coated and exposing and developing processes are performed during the manufacture of the display device. In the exposing and developing processes, the photoresist disposed at an edge of the display area may be partially developed due to a sudden pattern density change. In other words, due to a loading effect caused by a local pattern density difference at the edge of the display area, conductive patterns in the display area may not be uniform and consequently a short circuit may occur.

SUMMARY

A display device according to an exemplary embodiment of the present invention includes: a substrate that includes a first area and a second area; a plurality of pixels included in the first area; and a dummy pattern included in the second area, wherein a size of the dummy pattern is smaller than a pixel area corresponding to a first pixel among the plurality of pixels, a ratio of an area occupied by a pixel pattern of the first pixel with respect to the pixel area is a first value, a ratio of an area occupied by the dummy pattern with respect to a dummy area is greater than the first value, and the dummy area and the pixel area have the same size as each other.

The dummy pattern may include an island type pattern.

A number of the island type patterns may be more than one.

The island type pattern may include a polygon or a circle.

The first area may include the plurality of pixels, gate circuit portions connected to gate lines that are connected to the plurality of pixels, and a plurality of pads connected to data lines that are connected to the plurality of pixels.

The pixel pattern and the dummy pattern may be disposed on the same layer.

The pixel pattern may include a semiconductor layer.

The dummy pattern may include a first conductive layer and a second conductive layer, the second conductive layer and the first conductive layer are disposed on different layers, and the first conductive layer may overlap the second conductive layer.

The display device may further include an insulation layer disposed between the first conductive layer and the second conductive layer, wherein the first conductive layer and the second conductive layer may be insulated from each other by the insulation layer.

The pixel pattern may include a first pixel pattern disposed on the same layer as the first conductive layer and a second pixel pattern disposed on the same layer as the second conductive layer.

The first pixel pattern may be one among a gate electrode layer, a semiconductor layer, a data electrode layer, a pixel electrode layer, and a power source electrode layer, and the second pixel pattern may be another among the gate electrode layer, the semiconductor layer, the data electrode layer, the pixel electrode layer, and the power source electrode layer.

A display device according to an exemplary embodiment of the present invention includes: a substrate that includes a first area and a second area; a first pixel pattern disposed on the substrate in the first area; and a first dummy pattern disposed on the substrate in the second area, wherein a second ratio of an area occupied by the first dummy pattern with respect to a unit area is greater than a first ratio of an area occupied by the first pixel pattern with respect to the unit area.

The unit area may have the same size as a pixel area that corresponds to a pixel disposed in the first area.

The first dummy pattern may include a first island type pattern that is electrically insulated.

The first pixel pattern and the first dummy pattern may be disposed on the same layer on the substrate.

The display device may further include: an insulation layer disposed on the same layer as the first pixel pattern and the first dummy pattern; a second pixel pattern disposed on the insulation layer in the first area; and a second dummy pattern disposed on the insulation layer in the second area.

A fourth ratio of an area occupied by the second dummy pattern with respect to the unit area may be greater than a third ratio of an area occupied by the second pixel pattern with respect to the unit area.

The second dummy pattern may overlap the first dummy pattern.

The second dummy pattern may include a second island type pattern that is electrically insulated.

The second pixel pattern and the second dummy pattern may be disposed on the same layer on the substrate.

The first pixel pattern or the second pixel pattern may include a semiconductor layer.

A display device according to an exemplary embodiment of the present invention includes: a substrate including a display area and a peripheral area; a plurality of pixels included in the display area, wherein a pixel pattern is disposed in a pixel area; and a dummy pattern included in the peripheral area, wherein the dummy pattern is disposed in a dummy area, the dummy area and the pixel area are substantially the same size, the pixel pattern occupies a first area in the pixel area, the dummy pattern occupies a second area in the dummy area, and the second area is greater in size than the first area.

The dummy pattern may be disposed between a first insulating layer and a second insulating layer.

The dummy pattern may include a first dummy pattern and a second dummy pattern, the first dummy pattern may be disposed between a buffer layer and a first insulating layer, and the second dummy pattern may be disposed between the first insulating layer and a second insulating layer.

The dummy pattern may be disposed on the same layer as a semiconductor layer of a transistor.

DETAILED DESCRIPTION OF THE EMBODIMENTS

Figure 1:
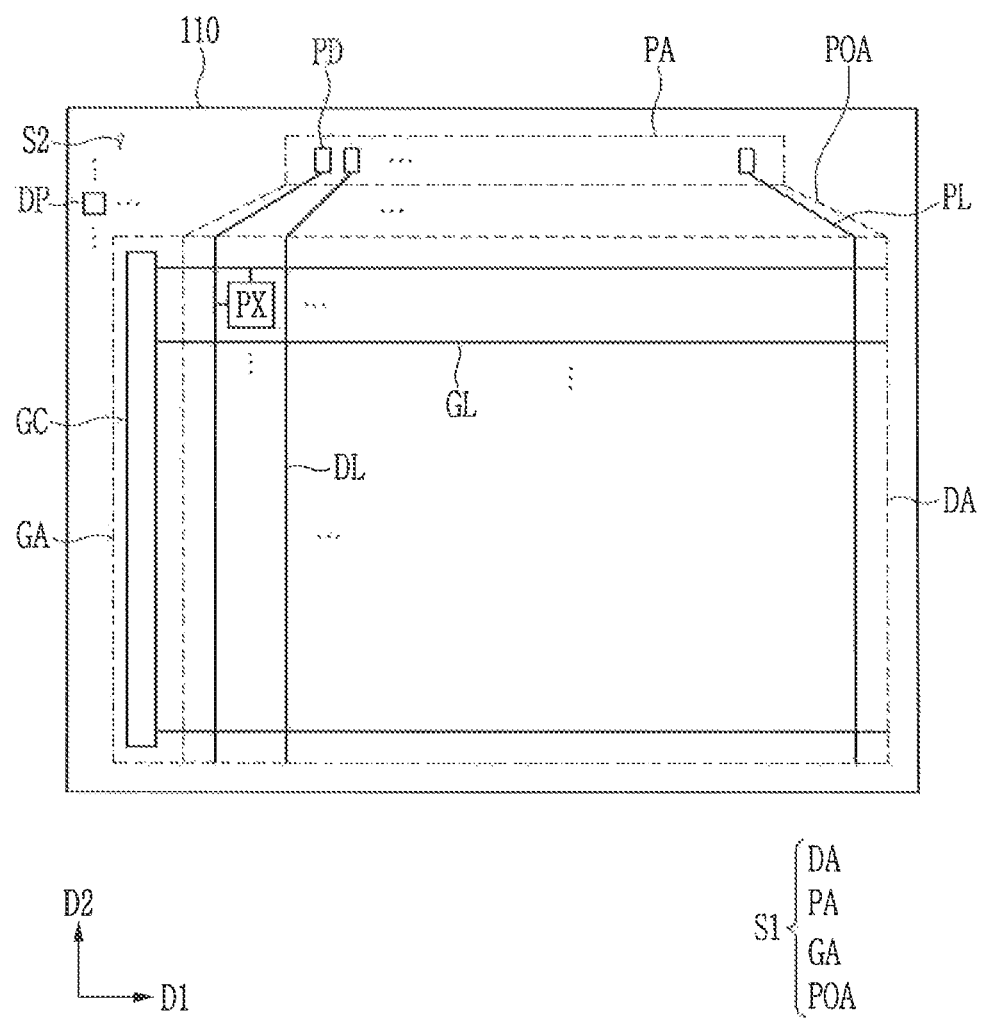
FIG. 1 is a block diagram of a display device according to an exemplary embodiment of the present invention.

Hereinafter, exemplary embodiments of the present invention will be described in more detail with reference to the accompanying drawings. As those skilled in the art would realize, the described embodiments may be modified in various different ways, and thus, should not be construed as being limited to the embodiments set forth herein.

Like reference numerals may designate like elements throughout the specification.

In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present.

Hereinafter, referring to FIG. 1, a display device according to an exemplary embodiment of the present invention will be described.

FIG. 1 is a block diagram of a display device according to an exemplary embodiment of the present invention.

Referring to FIG. 1, a display device includes a substrate 110, a plurality of pixels PX disposed on the substrate 110, a plurality of gate lines GL and a plurality of data lines DL connected to the plurality of pixels PX, a gate circuit portion GC connected to the plurality of gate lines GL, a plurality of fan-out lines PL connected to the plurality of data lines DL, and a plurality of pads PD connected to the plurality of fan-out lines PL.

The substrate 110 may include a first area S1 that includes a display area DA, a gate circuit area GA, a pad portion area PA, and a fan-out area POA. The substrate 110 may also include a second area S2 that includes the rest of the area of the substrate 110, except the first area S1. The phrase "on a plane" may mean a plane that is parallel with a first direction D1 and a second direction D2. The first direction D1 may be perpendicular or substantially perpendicular to the second direction D1. The first direction D1 may be a row direction and the second direction D2 may be a column direction.

The display area DA may include the plurality of pixels PX, the plurality of gate lines GL, and the plurality of data lines DL. In the display area DA, the plurality of pixels PX may be arranged in a matrix format. The plurality of gate lines GL may extend in the first direction D1. The plurality of gate line GL may be almost parallel with each other. The plurality of data lines DL may extend in the second direction D2. The plurality of data lines DL may be almost parallel with each other.

The gate circuit area GA may include the gate circuit portion GC. The gate circuit portion GC may be disposed along a side of the display area DA that extends in the second direction D2. The gate circuit portion GC may be connected to the plurality of gate lines GL. The gate circuit portion GC may generate a plurality of gate signals and apply the gate signals to the plurality of gate lines GL.

The pad portion area PA may include the plurality of pads PD. The plurality of pads PD may be arranged along a side of the display area DA that extends in the first direction D1. The plurality of pads PD may be connected to a data driver that generates a data voltage to be applied to the plurality of data lines DL.

The fan-out area POA is disposed between the pad portion area PA and the display area DA, and may include the plurality of fan-out lines PL. The plurality of fan-out lines PL connect the plurality of pads PD and the plurality of data lines DL with each other. The plurality of fan-out lines PL may transmit the data voltage generated in the data driver to the plurality of data lines DL.

The first area S1 may be an area where elements that are directly involved in the display of an image, such as the plurality of gates lines GL, the plurality of data lines DL, the gate circuit portions GC, the plurality of pads PD, the plurality of fan-out lines PL, and the like, are disposed.

The second area S2 may include a plurality of dummy patterns DP. The plurality of dummy patterns DP may be arranged in the first direction D1 and the second direction D2. A dummy pattern DP may be an island type pattern having a size that is smaller than the area of one pixel (e.g., PXA of FIG. 2). The island type pattern may not contact an adjacent pattern. The plurality of dummy patterns DP may be floated (or insulated). For example, the plurality of dummy patterns DP may not receive a voltage.

In a manufacturing process of the display device, when elements that are directly involved in displaying an image are formed in the first area S1, the plurality of dummy patterns DP may be formed in the second area S2. For example, when conductive patterns that correspond to the plurality of pixels PX are formed in the display area DA, the plurality of dummy patterns DP may be formed in the second area S2. Accordingly, when exposure and development processes are performed to form the conductive patterns, a density difference of local patterns can be prevented.

More specifically, the plurality of dummy patterns DP, which may not be directly involved in the display of an image, can prevent conductive patterns in the display area DA from being non-uniform and prevent a short circuit from happening in the display area DA.

Hereinafter, the pixel pattern PXP included in the first area S1 and the dummy pattern DP included in the second area S2 will be described in detail with reference to FIG. 2 and FIG. 3.

Figure 2:
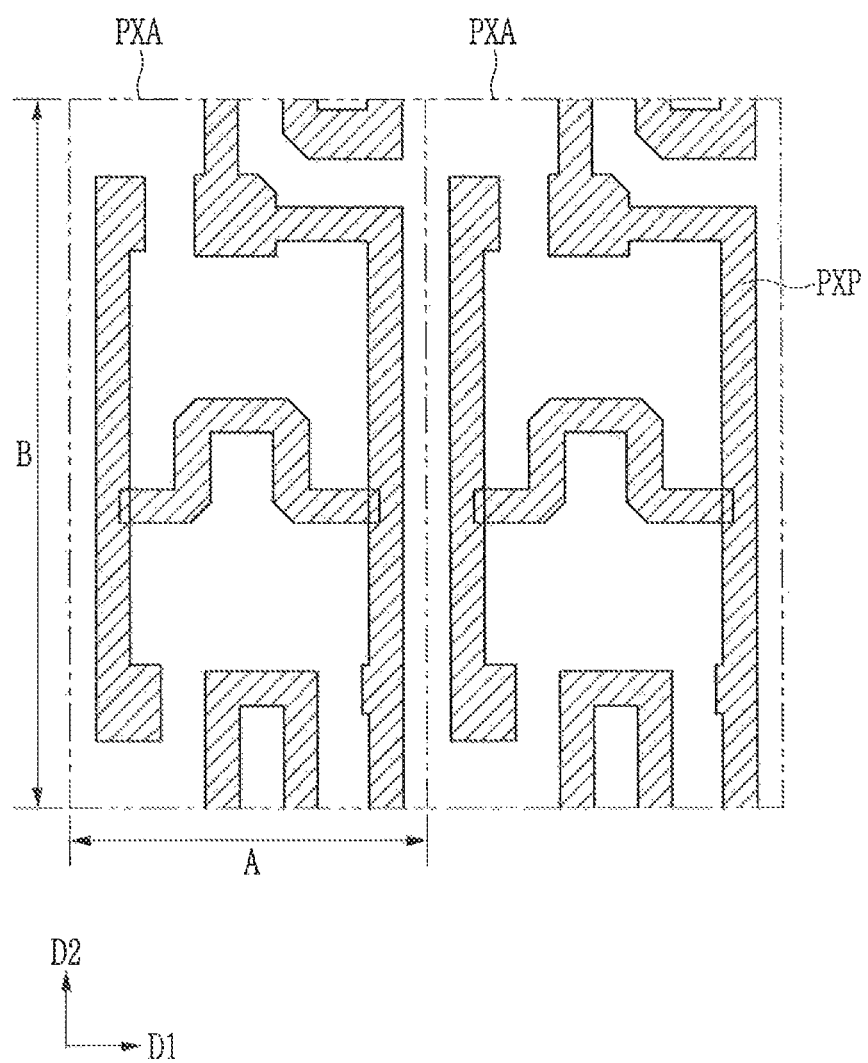
FIG. 2 is a top plan view of a pixel pattern included in the display device of FIG. 1, according to an exemplary embodiment of the present invention.

FIG. 2 is a top plan view of the pixel pattern PXP included in the display device of FIG. 1, according to an exemplary embodiment of the present invention. FIG. 3 is a top plan view of the dummy pattern DP included in the display device of FIG. 1, according to an exemplary embodiment of the present invention.

Referring to FIG. 2, the display area DA may include a plurality of pixel areas PXA that correspond to the plurality of pixels PX. In FIG. 2, a semiconductor layer (e.g., 132 of FIG. 4) of two pixel areas PXA are illustrated.

Each pixel area PXA may have a size that is predetermined according to the size of the display area DA and a resolution of the display device. For example, the pixel area PXA may be a quadrangle with a length A in the first direction D1 and a length B in the second direction D2. The pixel area PXA may have a size of A×B. For example, the length A in the first direction D1 may be 15.75 μm and the length B in the second direction D2 may be 31.5 μm. Each pixel area PXA includes a pixel pattern PXP that corresponds to the pixel PX. The pixel pattern PXP may be a conductive pattern included in the pixel area PXA. The shape of the pixel pattern PXP may be determined according to a type of the pixel PX and the conductive pattern that forms the pixel PX. For example, the pixel pattern PXP may be a semiconductor layer 132 that corresponds to the pixel PX. The pixel pattern PXP may have a width that corresponds to a critical dimension.

In the pixel area PXA, the pixel pattern PXP may occupy an area of a predetermined first ratio (or a first value). The first ratio of the area occupied by the pixel pattern PXP in the pixel area PXA may be called a density of the pixel pattern PXP. For example, the pixel pattern PXP may occupy an area of about 30% of the pixel area PXA. In other words, the first ratio (the first value) of the pixel pattern PXP in the pixel area PXA may be about 30%.

Figure 3:
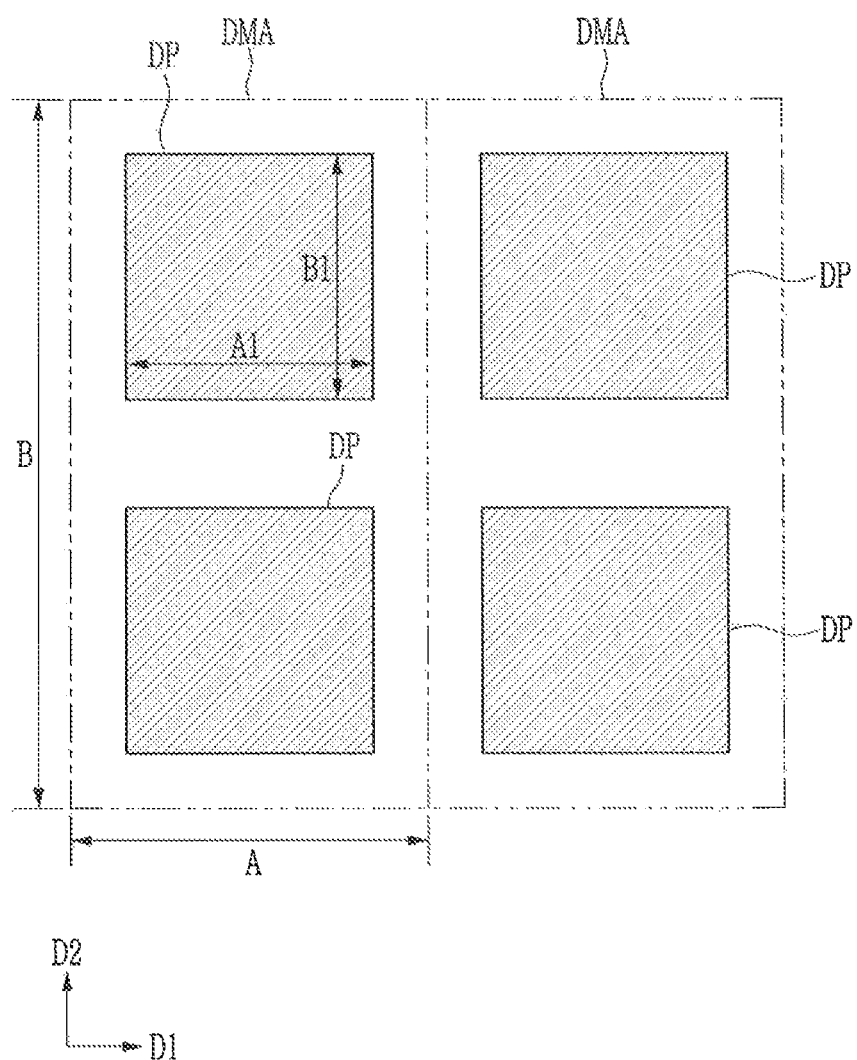
FIG. 3 is a top plan view of a dummy pattern included in the display device of FIG. 1, according to an exemplary embodiment of the present invention.

Referring to FIG. 3, a second area S2 may be divided into a plurality of dummy areas DMA, each having the same size as a pixel area PXA. Since the pixel area PXA and the dummy area DMA are the same in size, the pixel area PXA and dummy area DMA may be called a unit area.

Like the pixel area PXA, the dummy area DMA may be a quadrangle having a length of A in the first direction D1 and a length of B in the second direction D2, and thus, may have a size of A×B. For example, the length A of each dummy area DMA in the first direction D1 may be 15.75 μm, and the length B of each dummy area DMA in the second direction D2 may be 31.5 μm. In FIG. 3, two dummy areas DMA are illustrated.

One or more dummy patterns DP may be included in each of the plurality of dummy areas DMA. In FIG. 3, two dummy patterns DP are included in each of the plurality of dummy areas DMA. The dummy pattern DP may be smaller than the dummy area DMA. In other words, the size of the dummy pattern DP may be smaller than the pixel area PXA. For example, two dummy patterns DP are included in one dummy area DMA, and each dummy pattern DP may be a quadrangle having a length A1 in the first direction D1 and a length B1 in the second direction D2. Each dummy pattern DP may have a size of A1×B1. The length A1 of the dummy pattern DP in the first direction D1 is shorter than the length A of the dummy area DMA in the first direction D1, and the length B1 of the dummy pattern DP in the second direction D2 is shorter than the length B of the dummy area DMA in the second direction D2. For example, the dummy pattern DP may be a quadrangle of which the length A1 in the first direction D1 may be 11 μm and the length B1 in the second direction D2 is 11 μm. A distance between adjacent dummy patterns DP in the first direction D1 or the second direction D2 may be 4.75 μm.

Two dummy patterns DP included in the dummy area DMA may occupy an area of a predetermined second ratio (or a second value). The second ratio of the area occupied by the dummy pattern DP in the dummy area DMA may be called a density of the dummy pattern DP. For example, the two dummy patterns DP may occupy an area of about 50% of the dummy area DMA. In other words, the second ratio of the area occupied by the two dummy patterns DP may be about 50% of the dummy area DMA. The second ratio (the second value) of the area occupied by the two dummy patterns DP in the dummy area DMA may be greater than the first ratio (first value) of the area occupied by the pixel pattern PXP in the pixel area PXA. In other words, the second ratio of the area occupied by the dummy pattern DP with respect to the unit area may be greater than the first ratio of the area occupied by the pixel pattern PXP with respect to the unit area.

In addition, the pixel pattern PXP and the dummy pattern DP may be disposed on the same layer. Hereinafter, an example in which the pixel pattern PXP and the dummy pattern DP are disposed on the same layer will be described with reference to FIG. 4 and FIG. 5.

Figure 4:
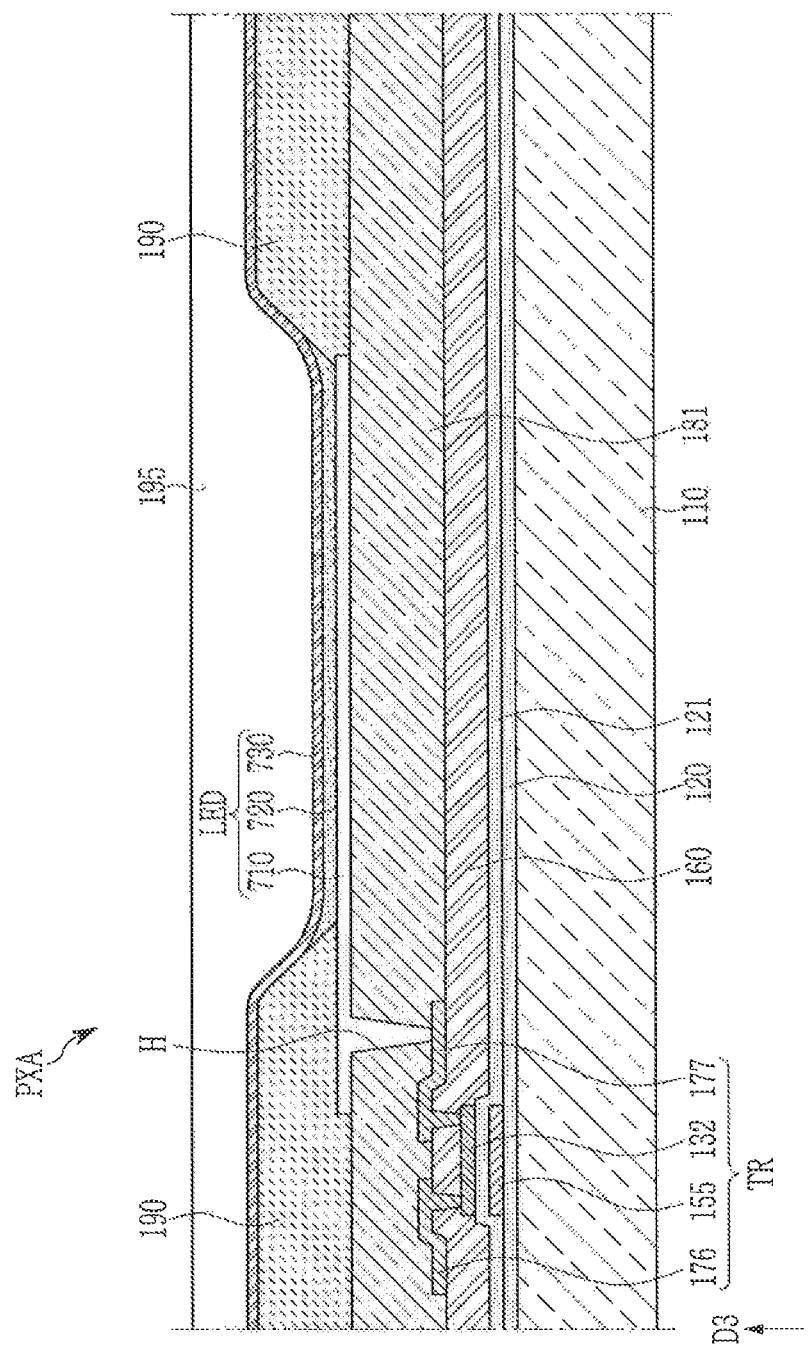
FIG. 4 is a cross-sectional view of a pixel area in the display device of FIG. 1, according to an exemplary embodiment of the present invention.

FIG. 4 is a cross-sectional view of the pixel area PXA in the display device of FIG. 1, according to an exemplary embodiment of the present invention. FIG. 4 may illustrate a cross-section of a part of the pixel area PXA, cut in a third direction D3 that is perpendicular to a plane that is formed by the first direction D1 and the second direction D2.

Referring to FIG. 4, the display device includes a substrate 110, a driving transistor TR, and a light emitting diode LED.

The substrate 110 includes an insulation material such as glass, plastic, and the like, and a buffer layer 120 is disposed on the substrate 110. The buffer layer 120 prevents permeation of an unnecessary component such as an impurity element or moisture. Furthermore, the buffer layer 120 planarizes the surface where the driving transistor TR is disposed. The buffer layer 120 may be omitted depending on a type of the substrate 110 and a process condition.

A gate electrode 155 is disposed on the buffer layer 120. The plurality of gate lines GL shown in FIG. 1 may be disposed on the same layer as the gate electrode 155. A layer that includes the gate lines GL and the gate electrode 155 may be called a gate electrode layer. A first insulation layer 121 is disposed on the gate electrode 155 and the buffer layer 120.

The semiconductor layer 132 is disposed on the first insulation layer 121. The semiconductor layer 132 may be made of amorphous silicon, polysilicon, or an oxide semiconductor. The semiconductor layer 132 overlaps the gate electrode 155. The first insulation layer 121 may be a single layer of silicon nitride, silicon oxide, and the like, or may have a double-layered structure of silicon nitride and silicon oxide. A second insulation layer 160 is disposed on the semiconductor layer 132 and the first insulation layer 121.

A source electrode 176 and a drain electrode 177 that face each other are disposed on the second insulation layer 160. The source electrode 176 may be connected to an end of the semiconductor layer 132 through a contact hole that penetrates the second insulation layer 160. The drain electrode 177 may be connected to another end of the semiconductor layer 132 through another contact hole that penetrates the second insulation layer 160. The plurality of data lines DL shown in FIG. 1 may be disposed on the same layer as the source electrode 176 and the drain electrode 177. The layer that includes the data lines DL, the source electrode 176, and the drain electrode 177 may be called a data electrode layer.

The gate electrode 155, the source electrode 176, the drain electrode 177, and the semiconductor layer 132 form the driving transistor TR. A channel of the driving transistor TR is formed in a portion of the semiconductor layer 132 between the source electrode 176 and the drain electrode 177.

A third insulation layer 181 is disposed on the driving transistor TR and the second insulation layer 160. The third insulation layer 181 may include an organic insulating material or an inorganic insulating material. The third insulation layer 181 may planarize the surface where a pixel electrode 710 is disposed.

The pixel electrode 710 is disposed on the third insulation layer 181, and the pixel electrode 710 is connected with the drain electrode 177 of the driving transistor TR through a contact hole H that penetrates the third insulation layer 181. The layer where the pixel electrode 710 is formed may be called a pixel electrode layer. The driving transistor TR provides a current corresponding to a data voltage to the pixel electrode 710.

An emission layer 720 is disposed on the pixel electrode 710, and a power source electrode 730 is disposed on the emission layer 720. The layer where the power source electrode 730 is disposed may be called a power source electrode layer. The emission layer 720 may include an organic light emitting material or an inorganic light emitting material. One of the pixel electrode 710 and the power source electrode 730 may be a reflective electrode and the other may be a transflective electrode. For example, in a top emission type of display device, the pixel electrode 710 may be a reflective electrode and the power source electrode 730 may be a transflective electrode.

The pixel electrode 710, the emission layer 720, and the power source electrode 730 form the light emitting diode LED. The pixel electrode 710 may be an anode of the light emitting diode LED, and the power source electrode 730 may be a cathode of the light emitting diode LED. Alternatively, the pixel electrode 710 may be a cathode of the light emitting diode LED and the power source electrode 730 may be an anode of the light emitting diode LED. Light is emitted from the light emitting diode LED when holes and electrons from the pixel electrode 710 and the power source electrode 730 are injected into the emission layer 720 and excitons formed by excited electrons and their associated holes fall from an excited state to a ground state. The light emitting diode LED may emit light of one of primary colors. The primary colors may include red, green, or blue. Alternatively, the primary colors may include yellow, cyan, or magenta.

A pixel defining layer 190 may be disposed at the periphery of the pixel electrode 710. The pixel defining layer 190 defines an area of the light emitting diode LED, in other words, a light emission area where light is emitted. The pixel defining layer 190 is disposed on a portion of the pixel electrode 710, and the emission layer 720 may be disposed on another portion of the pixel electrode 710 which is not covered by the pixel defining layer 190. The area where the emission layer 720 is disposed may be a light emitting area.

An encapsulation layer 195 that protects the light emitting diode LED may be disposed on the light emitting diode LED. The encapsulation layer 195 may include an organic insulating material or an inorganic insulating material.

Figure 5:
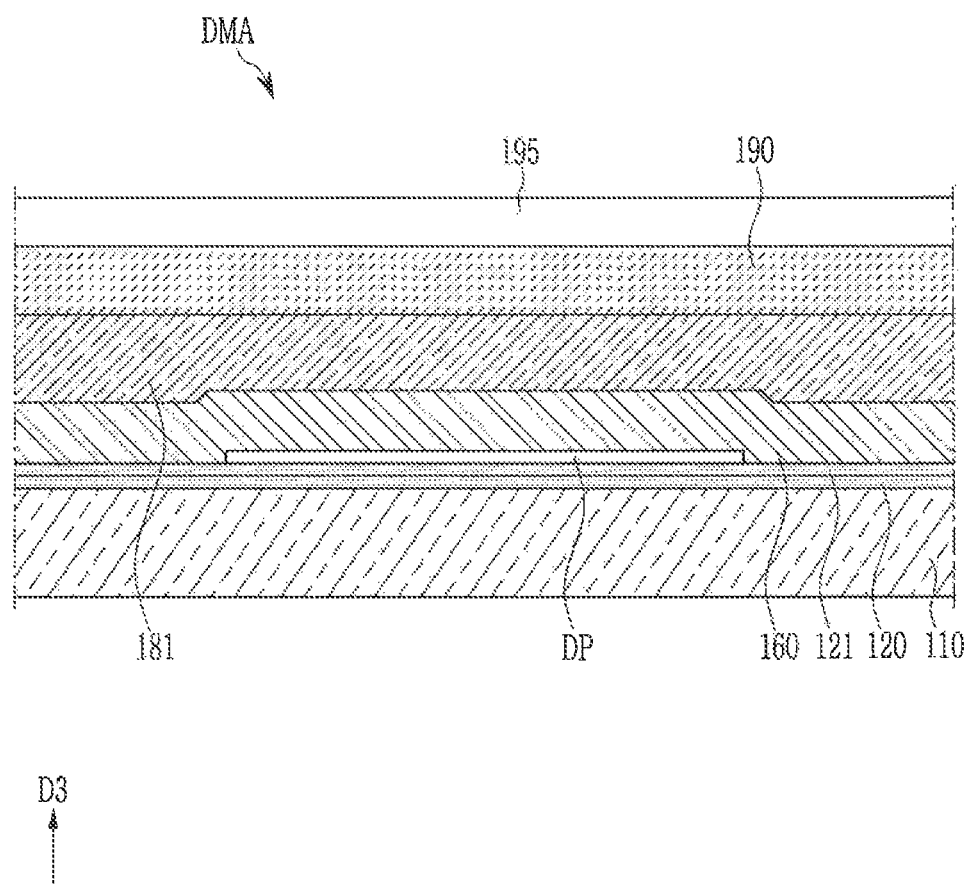
FIG. 5 is a cross-sectional view of a dummy pattern included in the display device of FIG. 1, according to an exemplary embodiment of the present invention.

FIG. 5 is a cross-sectional view of the dummy pattern DP included in the display device of FIG. 1, according to an exemplary embodiment of the present invention. FIG. 5 shows a cross-section of the dummy area DMA, cut in the third direction D3.

Referring to FIG. 5, in the dummy area DMA, the buffer layer 120 is disposed on the substrate 110, the first insulation layer 121 is disposed on the buffer layer 120, and the dummy pattern DP is disposed on the first insulation layer 121. In addition, the second insulation layer 160, the third insulation layer 181, the pixel defining layer 190, and the encapsulation layer 195 are sequentially disposed on the dummy pattern DP and the first insulation layer 121.

The dummy pattern DP is disposed between the first insulation layer 121 and the second insulation layer 160, and is disposed on the same layer as the semiconductor layer 132 that is disposed between the first insulation layer 121 and the second insulation layer 160 in the pixel area PXA. The dummy pattern DP may be formed when the semiconductor layer 132 is formed in a manufacturing process of the display device, and the dummy patter DP may be made of the same material as the semiconductor layer 132. The semiconductor layer 132 may be a single conductive layer, and the semiconductor layer 132 may be the pixel pattern PXP that corresponds to the dummy pattern DP.

Hereinafter, an exemplary embodiment of the present invention in which a dummy pattern DP includes conductive layers that are disposed in a plurality of different layers will be described.

Figure 6:
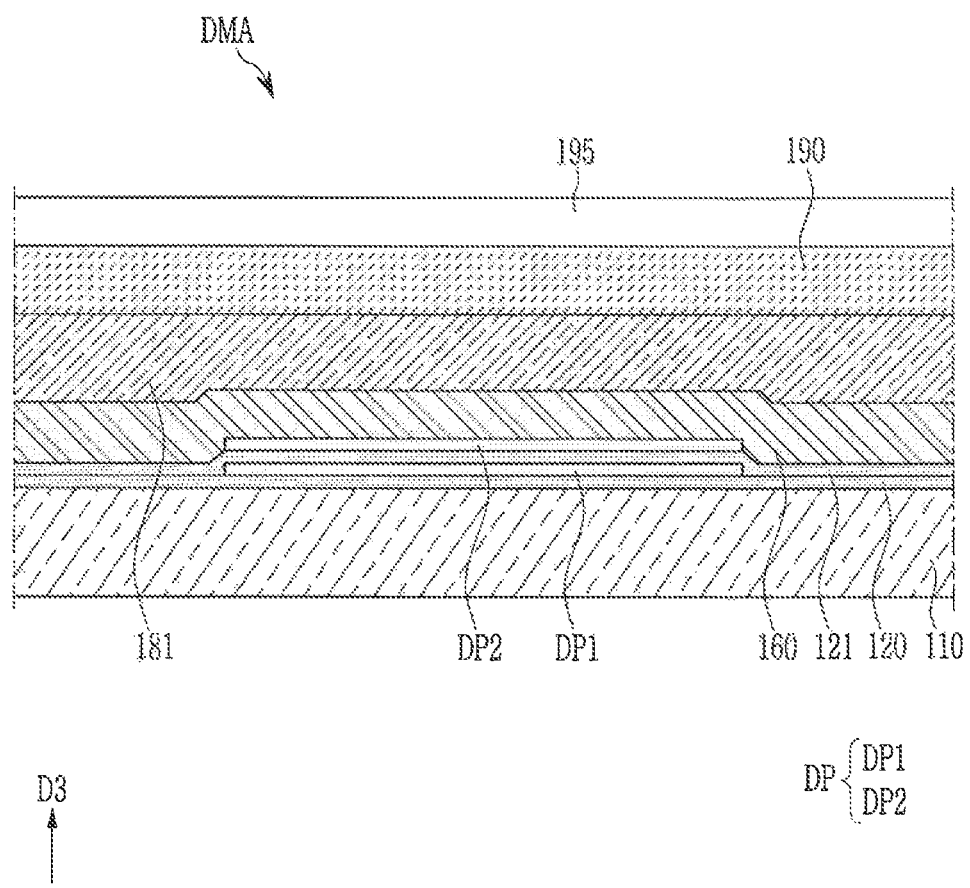
FIG. 6 is a cross-sectional view of the dummy pattern included in the display device of FIG. 1, according to an exemplary embodiment of the present invention.

FIG. 6 is a cross-sectional view of the dummy pattern DP included in the display device of FIG. 1, according to an exemplary embodiment of the present invention. FIG. 6 illustrates a cross-section of the dummy area DMA cut in the third direction D3.

Referring to FIG. 6, in the dummy area DMA, the butter layer 120 is disposed on the substrate 110, and a first dummy pattern DP1 is disposed on the buffer layer 120. The first insulation layer 121 is disposed on the first dummy pattern DP1 and the buffer layer 120, and a second dummy pattern DP2 is disposed on the first insulation layer 121. In addition, the second insulation layer 160, the third insulation layer 181, the pixel defining layer 190, and the encapsulation layer 195 are sequentially disposed on the second dummy pattern DP2 and the first insulation layer 121.

The first dummy pattern DP1 is disposed between the buffer layer 120 and the first insulation layer 121, and is disposed on the same layer as the gate electrode 155 that is disposed between the buffer layer 120 and the first insulation layer 121 in the pixel area PXA. In other words, the first dummy pattern DP1 may be disposed on the same layer as the gate electrode layer. The gate electrode layer is a first pixel pattern that corresponds to the first dummy pattern DP1. The first dummy pattern DP1 may be formed when the gate electrode layer is formed in the manufacturing process of the display device, and the first dummy pattern DP1 may be made of the same material as the gate electrode layer. In this case, a second ratio of an area occupied by the first dummy pattern DP1 with respect to the unit area may be greater than a first ratio of an area occupied by the gate electrode layer with respect to the unit area.

The second dummy pattern DP2 is disposed between the first insulation layer 121 and the second insulation layer 160, and is disposed on the same layer as the semiconductor layer 132 that is disposed between the first insulation layer 121 and the second insulation layer 160 in the pixel area PXA. The semiconductor layer 132 is a second pixel pattern that corresponds to the second dummy pattern DP2. The second dummy pattern DP2 may be formed when the semiconductor layer 132 is formed in the manufacturing process of the display device, and the second dummy pattern DP2 may be made of the same material as the semiconductor layer 132. In this case, a fourth ratio of an area occupied by the second dummy pattern DP2 with respect to the unit area may be greater than a third ratio of an area occupied by the semiconductor layer 132 with respect to the unit area.

The dummy pattern DP may include the first dummy pattern DP1 and the second dummy pattern DP2 that overlap each other in the third direction D3. The first dummy pattern DP1 may be a first conductive layer and the second dummy pattern DP2 may be a second conductive layer. In other words, the dummy pattern DP may include the first conductive layer and the second conductive layer that are disposed on different layers, while overlapping each other. The first insulation layer 121 is disposed between the first conductive layer and the second conductive layer, and the first conductive layer and the second conductive layer may be insulated from each other by the first insulation layer 121.

Figure 7:
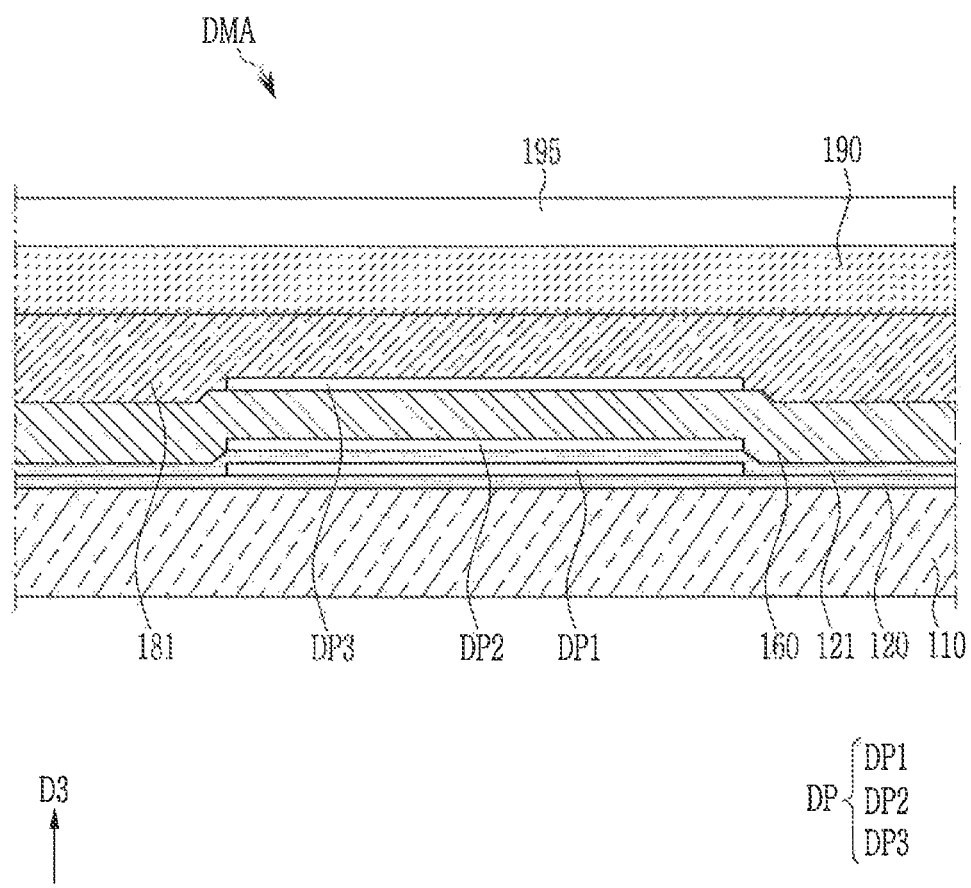
FIG. 7 is a cross-sectional view of the dummy pattern included in the display device of FIG. 1, according to an exemplary embodiment of the present invention.

FIG. 7 is a cross-sectional view of the dummy pattern DP included in the display device of FIG. 1, according to an exemplary embodiment of the present invention. FIG. 7 shows a cross-section of the dummy area DMA cut in the third direction D3.

Referring to FIG. 7, the buffer layer 120 is disposed on the substrate 110 and the first dummy pattern DP1 is disposed on the buffer layer 120 in the dummy area DMA. The first insulation layer 121 is disposed on the first dummy pattern DP1 and the buffer layer 120, and the second dummy patter DP2 is disposed on the first insulation layer 121. The second insulation layer 160 is disposed on the second dummy pattern DP2 and the first insulation layer 121, and a third dummy pattern DP3 is disposed on the second insulation layer 160. In addition, the third insulation layer 181, the pixel defining layer 190, and the encapsulation layer 195 are sequentially disposed on the third dummy pattern DP3 and the second insulation layer 160.

The first dummy pattern DP1 is disposed between the buffer layer 120 and the first insulation layer 121, and is disposed on the same layer as the gate electrode layer that is disposed between the buffer layer 120 and the first insulation layer 121.

The second dummy pattern DP2 is disposed between the first insulation layer 121 and the second insulation layer 160, and is disposed on the same layer as the semiconductor layer 132 that is disposed between the first insulation layer 121 and the second insulation layer 160.

The third dummy pattern DP3 is disposed between the second insulation layer 160 and the third insulation layer 181, and is disposed on the same layer as the source electrode 176 and the drain electrode 177 that are disposed between the second insulation layer 160 and the third insulation layer 181. In other words, the third dummy pattern DP3 may be disposed on the same layer as the data electrode layer. The data electrode layer is a third pixel pattern corresponding to the third dummy pattern DP3. The third dummy pattern DP3 may be formed then the data electrode layer is formed in the manufacturing process of the display device, and the third dummy pattern DP3 may be made of the same materials as the data electrode layer. In this case, a ratio of an area occupied by the third dummy pattern DP3 with respect to the unit area may be greater than a ratio of an area occupied by the data electrode layer with respect to the unit area.

The dummy pattern DP may include the first dummy pattern DP1, the second dummy pattern DP2, and the third dummy pattern DP3 that overlap in the third direction D3. The first dummy pattern DP1 may be a first conductive layer, the second dummy pattern DP2 may be a second conductive layer, and the third dummy pattern DP3 may be a third conductive layer. In other words, the dummy pattern DP may include the first conductive layer, the second conductive layer, and the third conductive layer that are different layers which overlap each other. The first conductive layer and the second conductive layer may be insulated from each other by the first insulation layer 121. The second insulation layer 160 is disposed between the second conductive layer and the third conductive layer, and the second conductive layer and the third conductive layer may be insulated from each other by the second insulation layer 160.

Figure 8:
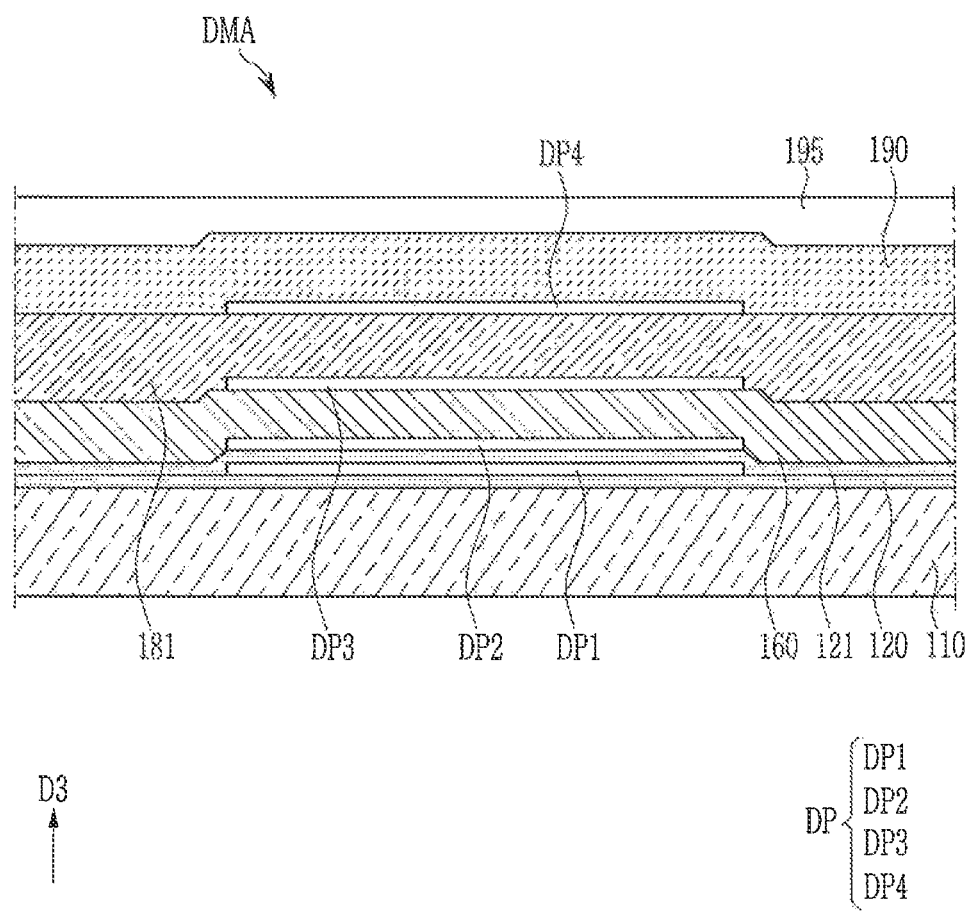
FIG. 8 is a cross-sectional view of the dummy pattern included in the display device of FIG. 1, according to an exemplary embodiment of the present invention.

FIG. 8 is a cross-sectional view of the dummy pattern DP included in the display device of FIG. 1, according to an exemplary embodiment of the present invention. FIG. 8 shows a cross-section of the dummy area DMA cut in the third direction D3.

Referring to FIG. 8, in the dummy area DMA, the buffer layer 120 is disposed on the substrate 110, and the first dummy pattern DP1 is disposed on the buffer layer 120. The first insulation layer 121 is disposed on the first dummy pattern DP1 and the buffer layer 120, and the second dummy pattern DP2 is disposed on the first insulation layer 121. The second insulation layer 160 is disposed on the second dummy pattern DP2 and the first insulation layer 121, and the third dummy pattern DP3 is disposed on the second insulation layer 160. The third insulation layer 181 is disposed on the third dummy pattern DP3 and the second insulation layer 160, and a fourth dummy pattern DP4 is disposed on the third insulation layer 181. In addition, the pixel defining layer 190 and the encapsulation layer 195 are sequentially disposed on the fourth dummy pattern DP4 and the third insulation layer 181.

The first dummy pattern DP1 is disposed between the buffer layer 120 and the first insulation layer 121, and is disposed on the same layer as the gate electrode layer that is disposed between the buffer layer 120 and the first insulation layer 121.

The second dummy pattern DP2 is disposed between the first insulation layer 121 and the second insulation layer 160, and is disposed on the same layer as the semiconductor layer 132 that is disposed between the first insulation layer 121 and the second insulation layer 160.

The third dummy pattern DP3 is disposed between the second insulation layer 160 and the third insulation layer 181, and is disposed on the same layer as the data electrode layer that is disposed between the second insulation layer 160 and the third insulation layer 181.

The fourth dummy pattern DP4 is disposed between the third insulation layer 181 and the pixel defining layer 190, and is disposed on the same layer as the pixel electrode 710 that is disposed between the third insulation layer 181 and the pixel defining layer 190. In other words, the fourth dummy pattern DP4 may be disposed on the same layer as the pixel electrode layer. The pixel electrode layer is a fourth pixel pattern that corresponds to the fourth dummy pattern DP4. The fourth dummy pattern DP4 may be formed when the pixel electrode layer is formed in the manufacturing process of the display device, and the fourth dummy pattern DP4 may be made of the same material as the pixel electrode layer. In this case, a ratio of an area occupied by the fourth dummy pattern DP4 with respect to the unit area may be greater than a ratio of an area occupied by the pixel electrode layer with respect to the unit area.

The dummy pattern DP may include the first dummy pattern DP1, the second dummy pattern DP2, the third dummy pattern DP3, and the fourth dummy pattern DP4 that overlap in the third direction D3. The first dummy pattern DP1 may be a first conductive layer, the second dummy pattern DP2 may be a second conductive layer, the third dummy pattern DP3 may be a third conductive layer, and the fourth dummy pattern DP4 may be a fourth conductive layer. In other words, the dummy pattern DP 1o may include the first conductive layer, the second conductive layer, the third conductive layer, and the fourth conductive layer that are disposed on different layers and overlap each other. The first conductive layer and the second conductive layer may be insulated from each other by the first insulation layer 121. The second conductive layer and the third conductive layer may be insulated from each other by the second insulation layer 160. The third insulation layer 181 may be disposed between the third conductive layer and the fourth conductive layer, and the third conductive layer and the fourth conductive layer may be insulated from each other by the third insulation layer 181.

Figure 9:
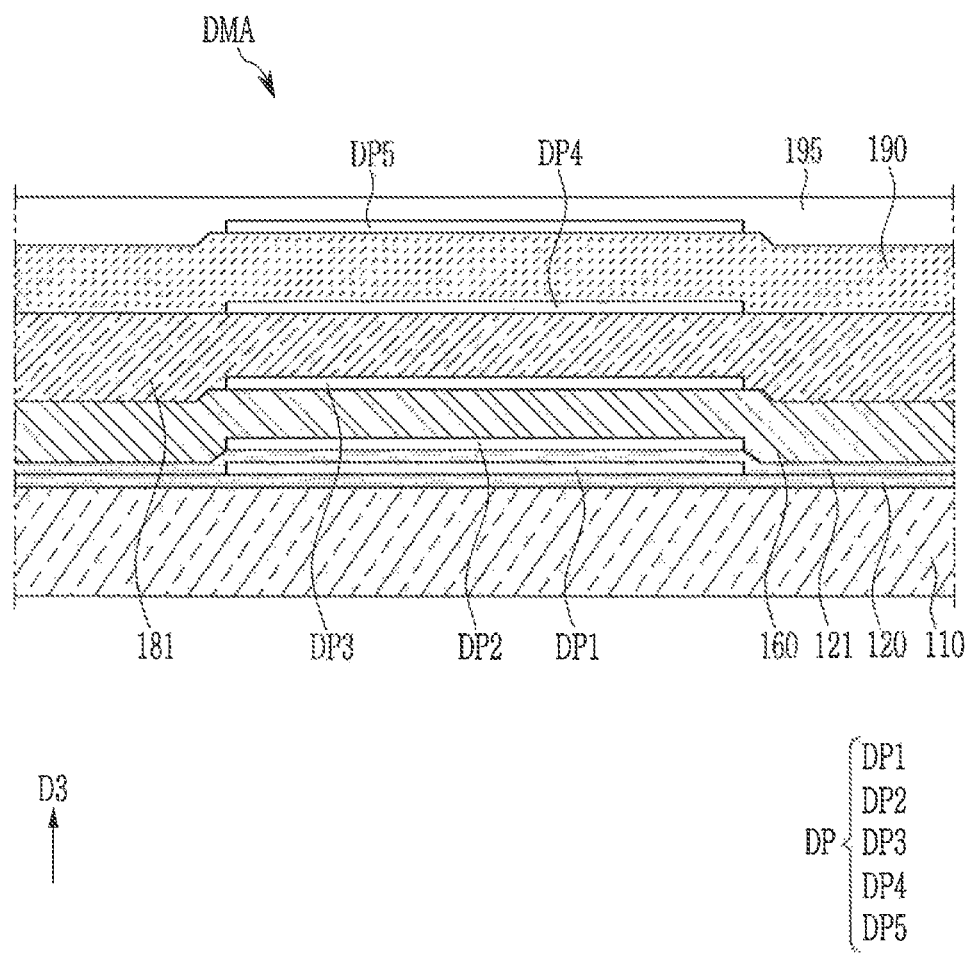
FIG. 9 is a cross-sectional view of the dummy pattern included in the display device of FIG. 1, according to an exemplary embodiment of the present invention.

FIG. 9 is a cross-sectional view of the dummy pattern DP included in the display device of FIG. 1, according to an exemplary embodiment of the present invention. FIG. 9 shows a cross-section of the dummy area DMA cut in the third direction D3.

Referring to FIG. 9, in the dummy area DMA, the buffer layer 120 is disposed on the substrate 110, and the first dummy pattern DP1 is disposed on the buffer layer 120. The first insulation layer 121 is disposed on the first dummy pattern DP1 and the buffer layer 120, and the second dummy pattern DP2 is disposed on the first insulation layer 121. The second insulation layer 160 is disposed on the second dummy pattern DP2 and the first insulation layer 121, and the third dummy pattern DP3 is disposed on the second insulation layer 160. The third insulation layer 181 is disposed on the third dummy pattern DP3 and the second insulation layer 160, and the fourth dummy pattern DP4 is disposed on the third insulation layer 181. The pixel defining layer 190 is disposed on the fourth dummy pattern DP4 and the third insulation layer 181, and a fifth dummy pattern DP5 is disposed on the pixel defining layer 190. The encapsulation layer 195 is disposed on the fifth dummy pattern DP5 and the pixel defining layer 190.

The first dummy pattern DP1 is disposed between the buffer layer 120 and the first insulation layer 121, and is disposed on the same layer as the gate electrode layer that is disposed between the buffer layer 120 and the first insulation layer 121.

The second dummy pattern DP2 is disposed between the first insulation layer 121 and the second insulation layer 160, and is disposed on the same layer as the semiconductor layer 132 that is disposed between the first insulation layer 121 and the second insulation layer 160.

The third dummy pattern DP3 is disposed between the second insulation layer 160 and the third insulation layer 181, and is disposed on the same layer as the data electrode layer that is disposed between the second insulation layer 160 and the third insulation layer 181.

The fourth dummy pattern DP4 is disposed between the third insulation layer 181 and the pixel defining layer 190, and is disposed on the same layer as the pixel electrode 710 that is disposed between the third insulation layer 181 and the pixel defining layer 190.

The fifth dummy pattern DP5 is disposed between the pixel defining layer 190 and the encapsulation layer 195, and is disposed on the same layer as the power source electrode 730 that is disposed between the pixel defining layer 190 and the encapsulation layer 195. In other words, the fifth dummy pattern DP5 may be disposed on the same layer as the power source electrode. The power source electrode layer is a fifth pixel pattern that corresponds to the fifth dummy pattern DP5. The fifth dummy pattern DP5 may be formed when the power source electrode layer is formed in the manufacturing process of the display device, and the fifth dummy pattern DP5 may be made of the same material as the power source electrode layer. In this case, a ratio of an area occupied by the fifth dummy pattern DP5 with respect to the unit area may be greater than a ratio of an area occupied by the power source electrode layer with respect to the unit area.

The dummy pattern DP may include the first dummy pattern DP1, the second dummy pattern DP2, the third dummy pattern DP3, the fourth dummy pattern DP4, and the fifth dummy pattern DP5 that overlap in the third direction D3. The first dummy pattern DP1 may be a first conductive layer, the second dummy pattern DP2 may be a second conductive layer, the third dummy pattern DP3 may be a third conductive layer, the fourth dummy pattern DP4 may be a fourth conductive layer, and the fifth dummy pattern DP5 may be a fifth conductive layer. In other words, the dummy pattern DP may include the first conductive layer, the second conductive layer, the third conductive layer, the fourth conductive layer, and the fifth conductive layer that are different layers and overlap each other. The first conductive layer and the second conductive layer may be insulated from each other by the first insulation layer 121. The second conductive layer and the third conductive layer may be insulated from each other by the second insulation layer 160. The third conductive layer and the fourth conductive layer may be insulated from each other by the third insulation layer 181. The pixel defining layer 190 is disposed between the fourth conductive layer and the fifth conductive layer, and the fourth conductive layer and the fifth conductive layer may be insulated from each other by the pixel defining layer 190.

In FIG. 6 to FIG. 9, the first to fifth dummy patterns DP1, DP2, DP3, DP4, and DP5 respectively have the same size on a plane. However, the size of each of the first to fifth dummy patterns DP1, DP2, DP3, DP4, and DP5 on a plane may vary within a range that can be included in the dummy area DMA. In other words, at least one of the first to fifth dummy patterns DP1, DP2, DP3, DP4, and DP5 may have a different size on a plane. Alternatively, the dummy pattern DP may include a combination of two or more selected from the first to fifth dummy patterns DP1, DP2, DP3, DP4, and DP5.

Hereinafter, various types of the dummy patterns DP on a plane will be described with reference to FIG. 10 to FIG. 13. Differences with respect to FIG. 3 will be mainly described, and redundant explanations may be omitted.

Figure 10:
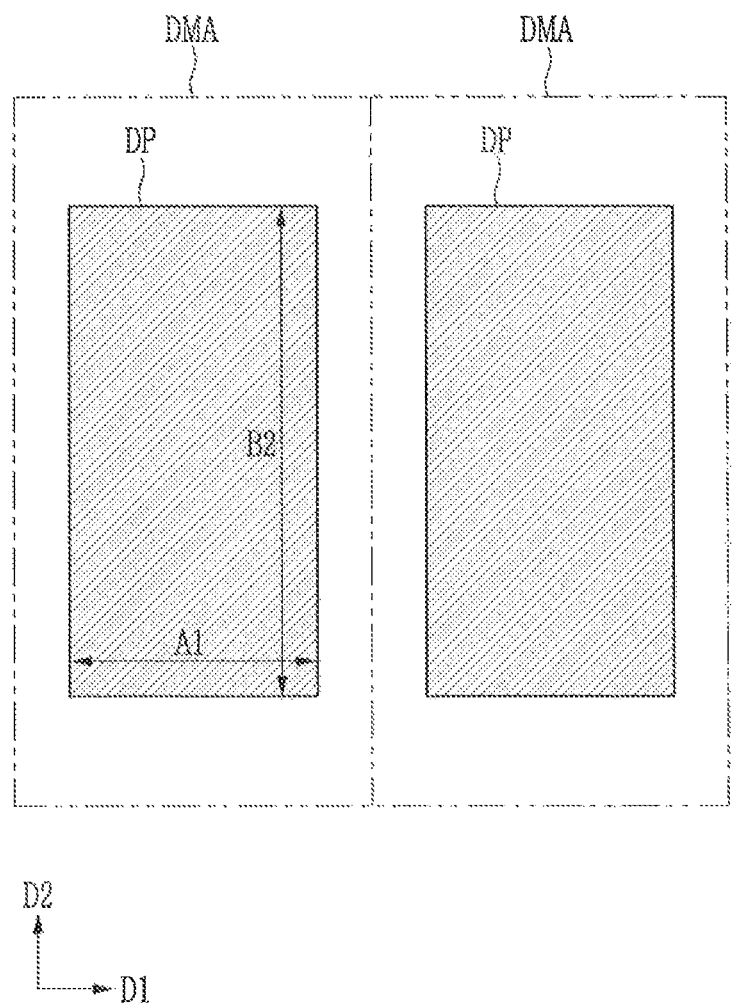
FIG. 10 is a top plan view of the dummy pattern included in the display device of FIG. 1, according to an exemplary embodiment of the present invention.

FIG. 10 is a top plan view of the dummy pattern DP included in the display device of FIG. 1, according to an exemplary embodiment of the present invention.

Referring to FIG. 10, the dummy pattern DP may be included in each of the plurality of dummy areas DMA. The dummy pattern DP may be quadrangular wherein a length in the first direction D1 is A1 and a length in the second direction D2 is B2, and may have a size of A1×B2. The length A1 of the dummy pattern DP in the first direction D1 is shorter than a length of the dummy area DMA in the first direction D1, and the length B2 of the dummy pattern DP in the second direction D2 is shorter than a length of the dummy area DMA in the second direction D2. For example, the dummy pattern DP may be a quadrangle of which a length A1 in the first direction D1 is 11 μm and a length B2 in the second direction is 22 μm.

In the embodiment of FIG. 10, the size of the dummy pattern DP may make a second ratio (second value) of an area occupied by the dummy pattern DP in the dummy area DMA greater than a first ratio (first value) of an area occupied by the pixel pattern PXP in the pixel area PXA.

Figure 11:
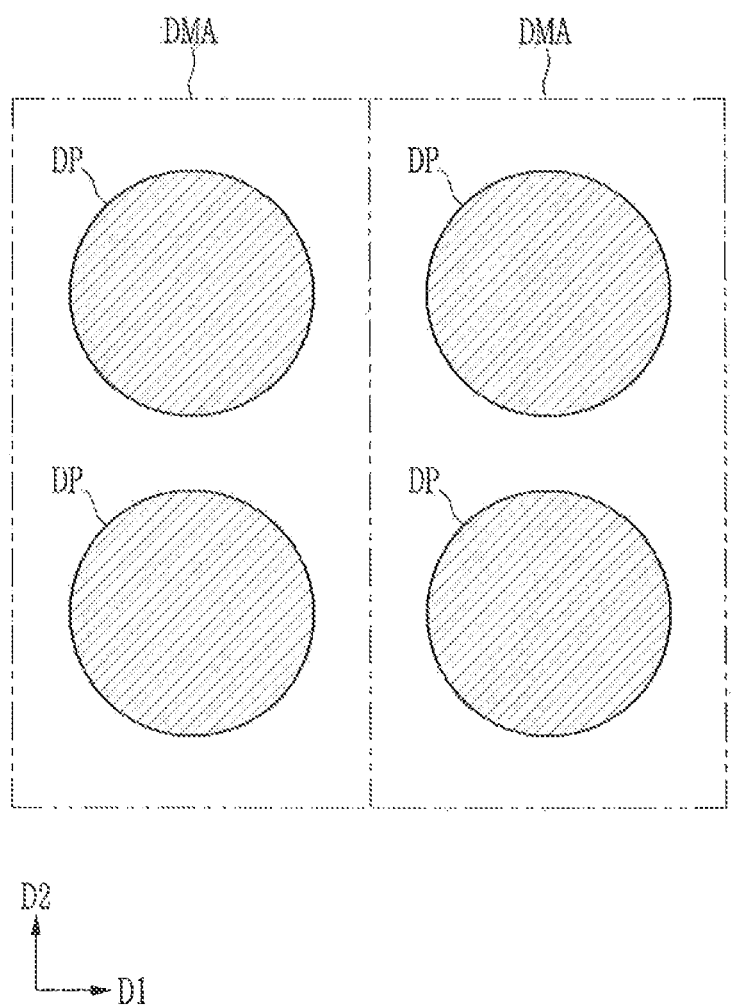
FIG. 11 is a top plan view of the dummy pattern included in the display device of FIG. 1, according to an exemplary embodiment of the present invention.

FIG. 11 is a top plan view of the dummy pattern DP included in the display device of FIG. 1, according to an exemplary embodiment of the present invention.

Referring to FIG. 11, each of the plurality of dummy areas DMA may include two circular dummy patterns DP. When a length of the dummy area DMA in the first direction D1 is shorter than a length of the dummy area DMA in the second direction D2, a diameter of the circular dummy pattern DP may be shorter than a length of the dummy area DMA in the first direction D1.

In the embodiment of FIG. 11, the size of the dummy pattern DP may make a second ratio (second value) of an area occupied by the dummy pattern DP in the dummy area DMA greater than a first ratio (first value) of an area occupied by the pixel pattern PXP in the pixel area PXA.

Figure 12:
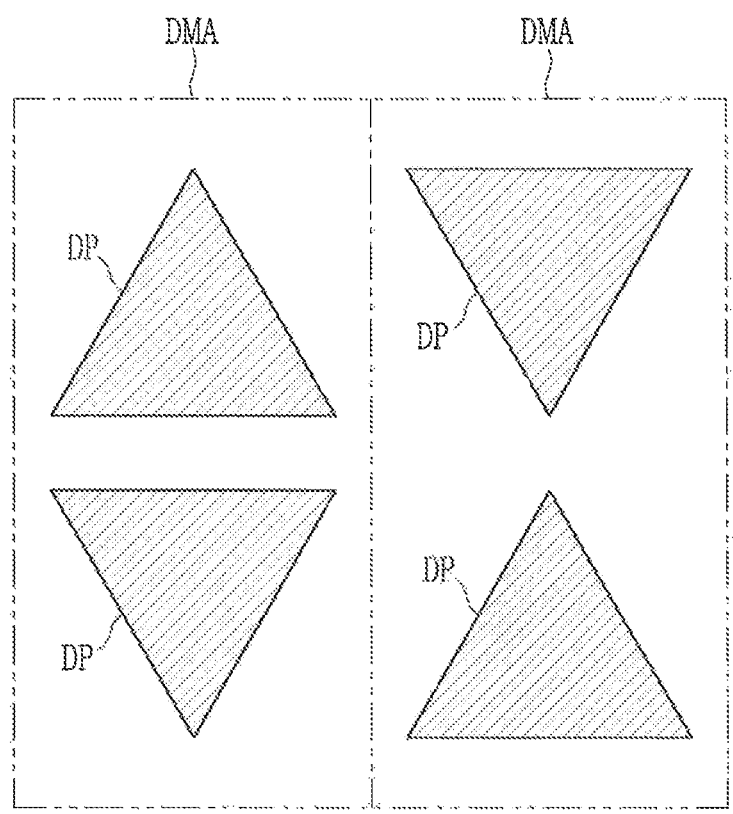
FIG. 12 is a top plan view of the dummy pattern included in the display device of FIG. 1, according to an exemplary embodiment of the present invention.

FIG. 12 is a top plan view of the dummy pattern included in the display device of FIG. 1, according to an exemplary embodiment of the present invention.

Referring to FIG. 12, each of the plurality of dummy areas DMA may include a triangular dummy pattern DP and an inverted triangular dummy pattern DP. Alignments of the triangular dummy patterns DP and the inverted triangular dummy patterns DP in adjacent dummy areas DMA may be opposite to each other. The alignments of triangular dummy patterns DP and inverted triangular dummy patterns DP in the plurality of dummy areas DMA may be varied from those shown in FIG. 12. When a length of the dummy area DMA in the first direction D1 is shorter than a length of the dummy area DMA in the second direction D2, a length of the longest side of a triangular dummy pattern DP or an inverted triangular dummy pattern DP may be shorter than a length of the dummy area DMA in the first direction D1.

In the embodiment of FIG. 12, the size of the dummy pattern DP may make a second ratio (second value) of an area occupied by the dummy pattern DP in the dummy area DMA greater than a first ratio (first value) of an area occupied by the pixel pattern PXP in the pixel area PXA.

Figure 13:
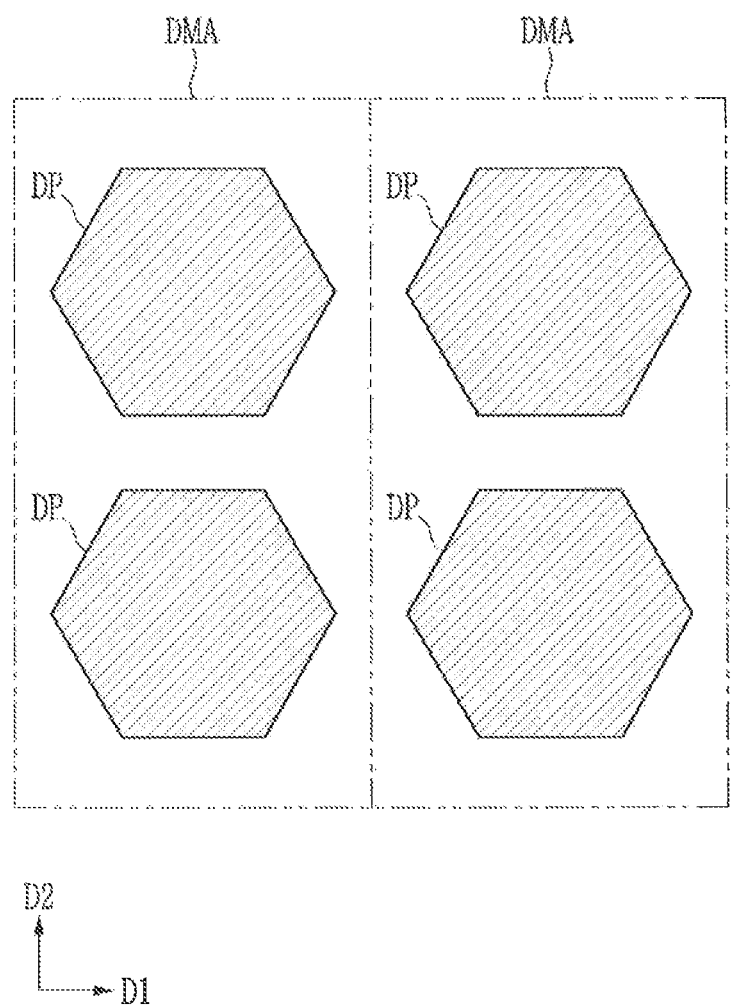
FIG. 13 is a top plan view of the dummy pattern included in the display device of FIG. 1, according to an exemplary embodiment of the present invention.

FIG. 13 is a top plan view of the dummy pattern DP included in the display device of FIG. 1, according to an exemplary embodiment of the present invention.

Referring to FIG. 13, each of the plurality of dummy areas DMA may include two hexagonal dummy patterns DP. When a length of the dummy area DMA in the first direction D1 is shorter than a length of the dummy area DMA in the second direction D2, a diagonal length of the hexagonal dummy pattern DP may be shorter than the length of the dummy area DMA in the first direction D1.

In the embodiment of FIG. 13, the size of the dummy pattern DP may make a second ratio (second value) of an area occupied by the dummy pattern DP in the dummy area DMA greater than a first ratio (first value) of an area occupied by the pixel pattern PXP in the pixel area PXA.

As shown in FIG. 3, and FIG. 10 to FIG. 13, the dummy pattern DP may be an island type having a shape of a polygon or a circle.

According to an exemplary embodiment of the present invention, uniformity of conductive patterns that correspond to the plurality of pixels can be increased, and a short circuit can be prevented. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprising:
a substrate that includes a first area and a second area;
a plurality of pixels included in the first area; and
a dummy pattern included in the second area,
wherein the first area and the second area do not overlap each other on a plane,
a size of the dummy pattern is smaller than a pixel area corresponding to a first pixel among the plurality of pixels,
a ratio of an area occupied by a pixel pattern of the first pixel with respect to the pixel area is a first value, and
a ratio of an area occupied by the dummy pattern with respect to a dummy area is a second value that is greater than the first value.

2. The display device of claim 1, wherein the dummy pattern comprises an island type pattern.

3. The display device of claim 2, wherein a number of the island type patterns is more than one.

4. The display device of claim 2, wherein the island type pattern comprises a polygon or a circle.

5. The display device of claim 1, wherein the first area comprises the plurality of pixels, gate circuit portions connected to gate lines that are connected to the plurality of pixels, and a plurality of pads connected to data lines that are connected to the plurality of pixels.

6. The display device of claim 1, wherein the pixel pattern and the dummy pattern are disposed on the same layer.

7. The display device of claim 6, wherein the pixel pattern comprises a semiconductor layer.

8. The display device of claim 1, wherein the dummy pattern comprises a first conductive layer and a second conductive layer, the second conductive layer and the first conductive layer are disposed on different layers, and
the first conductive layer overlaps the second conductive layer.

9. The display device of claim 8, further comprising an insulation layer disposed between the first conductive layer and the second conductive layer, wherein the first conductive layer and the second conductive layer are insulated from each other by the insulation layer.

10. The display device of claim 8, wherein the pixel pattern comprises a first pixel pattern disposed on the same layer as the first conductive layer and a second pixel pattern disposed on the same layer as the second conductive layer.

11. The display device of claim 10, wherein the first pixel pattern is one among a gate electrode layer, a semiconductor layer, a data electrode layer, a pixel electrode layer, and a power source electrode layer, and the second pixel pattern is another among the gate electrode layer, the semiconductor layer, the data electrode layer, the pixel electrode layer, and the power source electrode layer.

12. The display device of claim 1, wherein the dummy area and the pixel area have the same size as each other.

* * * * *